United States Patent [19]

Nagakawa et al.

[11] Patent Number: 5,416,346
[45] Date of Patent: May 16, 1995

[54] CHARGE TRANSFERRING DEVICE HAVING AN FDA TYPE CHARGE DETECTING SECTION AND A METHOD FOR PRODUCING THE SAME

[75] Inventors: Tadashi Nagakawa, Nabari; Kazuo Hashiguchi, Shiki, both of Japan

[73] Assignee: Sharp Kabushiki Kaisha, Osaka, Japan

[21] Appl. No.: 201,181

[22] Filed: Feb. 24, 1994

[30] Foreign Application Priority Data

Feb. 25, 1993 [JP] Japan .................................. 5-037086

[51] Int. Cl.6 ...................... H01L 29/78; H01L 27/01; H01L 27/13
[52] U.S. Cl. ......................... 257/239; 257/67; 257/236; 257/240
[58] Field of Search ................... 257/67, 236, 239, 240

[56] References Cited

U.S. PATENT DOCUMENTS

| | | | |
|---|---|---|---|
| 4,672,645 | 6/1987 | Bluzer et al. | 377/60 |
| 4,984,045 | 1/1991 | Matsunaga | 357/24 |
| 5,192,990 | 3/1993 | Stevens | 257/239 |

FOREIGN PATENT DOCUMENTS

| | | | |
|---|---|---|---|
| 63-244883 | 10/1988 | Japan | 257/237 |
| 3-116840 | 5/1991 | Japan | 257/237 |
| 4-11774 | 1/1992 | Japan | . |
| WO88/02186 | 3/1988 | WIPO | . |

OTHER PUBLICATIONS

M. Yoshihisa, *Patent Abstracts of Japan*, vol. 5, No. 78 (1981).

*Primary Examiner*—Ngan V. Ngo
*Attorney, Agent, or Firm*—David G. Conlin; Peter F. Corless

[57] ABSTRACT

A charge transfer device includes: a transfer channel for transferring a charge in a charge transfer direction; a charge detecting section having a diffusion layer for storing the charge transferred through the transfer channel and for inducing a voltage corresponding to the amount of the stored charge; and a transistor for detecting the induced voltage, the transistor having: a gate electrode formed on the diffusion layer, the gate electrode being in direct contact with the diffusion layer; a gate insulating film formed on the gate electrode; and a channel region formed above the gate electrode.

8 Claims, 5 Drawing Sheets

CHARGE TRANSFERRING DEVICE HAVING AN FDA TYPE CHARGE DETECTING SECTION AND A METHOD FOR PRODUCING THE SAME

BACKGROUND OF THE INVENTION

1. Field of the Invention

The present invention relates to a charge transfer device and a method for producing the same, and more particularly to a charge transfer device including an FDA (Floating Diffusion Amplifier) type charge detecting section and a method for producing the same.

2. Description of the Related Art

FIG. 6 shows in part a conventional charge transfer device 101. As is shown in FIG. 6, the charge transfer device 101 includes a transfer channel 102 for transferring a charge, a charge detecting section 103 for detecting a charge, and a source follower amplifier 104. FIG. 7 is a circuit diagram showing the source follower amplifier 104. As is shown in FIG. 7, the source follower amplifier 104 includes transistors $Q_1$, $Q_2$, $Q_3$, and $Q_4$. The transistors $Q_2$ and $Q_3$ are not shown in FIG. 6 for conciseness and clarity.

A charge is transferred in the transfer channel 102 when a two-phase clock pulse of $\Phi 1$ and $\Phi 2$ is applied to transfer electrodes 105. The charge in the transfer channel 102 is transferred to the charge detecting section 103 in accordance with a timing of an output gate pulse $\Phi OG$ applied to an electrode 106, and is stored in the charge detecting section 103. The signal charge is converted into an output signal in the form of a voltage at the source follower amplifier 104 (charge/voltage conversion). More specifically, a voltage which is in proportion to the amount of the charge stored in the charge detecting section 103 is detected by the transistor $Q_1$ in the source follower amplifier 104, and is amplified in the source follower amplifier 104 so as to be detected as an output signal. When the output signal is detected, the charge in a charge detecting section 103 is drained to a reset drain RD in accordance with a timing of a reset gate pulse $\Phi RG$.

Hereinafter, the charge detecting section 103 and the transistor $Q_1$ will be described in more detail, with reference to FIG. 8. FIG. 8 is a view showing an 8—8 cross section of the charge transfer device 101 shown in FIG. 6. As is shown in FIG. 8, a $P^-$-type first diffusion layer 111 is formed in a semiconductor substrate 110. The charge detecting section 103 is composed of an $N^+$-type floating diffusion layer 112 formed in the first diffusion layer 111. Second diffusion layers 113 to 115 are also formed in the first diffusion layer 111.

The transistor $Q_1$ includes a portion 116 of the first diffusion layer 111 as a channel thereof, the portion 116 being interposed between the second diffusion layers 114 and 115. The transistor $Q_1$ further includes a gate insulating film 117 formed on the portion 116 and a gate electrode 118 formed on the gate insulating film 117. The floating diffusion layer 112 is electrically connected to the gate electrode 118 through a wire 119. As is shown in FIG. 6, a source 120 and a drain 121 are formed so as to interpose the gate electrode 118 therebetween.

A charge q transferred in the charge transfer device 101 is converted into a voltage V in accordance with equations (1) and (2) shown below:

$$C_{FD} = C_d + C_g + C_l \quad (1)$$

$$V = q/C_{FD} \quad (2)$$

wherein $C_d$ represents the junction capacitance of the floating diffusion layer 112; $C_g$ represents the gate capacitance of the transistor $Q_1$; and $C_l$ represents parasitic capacitance that is mainly derived from a wire between the floating diffusion layer 112 and the transistor $Q_1$. A sum total of the capacitances $C_d$, $C_g$, and $C_l$ equals the detection capacitance $C_{FD}$ that contributes to charge/voltage conversion.

Currently, in the case of a CCD (Charge Coupled Device) solid imaging device using a charge transfer device mentioned above, the detection capacitance $C_{FD}$ is approximately 10 to 15 fF, in which the capacitance components $C_d$, $C_g$, and $C_l$ make substantially equal contributions to the overall detection capacitance $C_{FD}$.

As is seen from the equation (2), the voltage V increases as the detection capacitance $C_{FD}$ decreases, given that the detected charge q is constant. In recent years, there has been a demand for increasing the number of the pixels of a video camera, etc. in which a CCD solid imaging device is used, as well as a demand for miniaturizing such a video camera, etc. There has been a corresponding demand for a smaller and higher-performance charge transfer device. In particular, improvement in the charge/voltage conversion efficiency of such CCD solid imaging devices has been desired.

One method to meet the above-mentioned demands is to lower the detection capacitance $C_{FD}$. As is described above, the voltage V increases as the detection capacitance $C_{FD}$ decreases, given that the detected charge q is constant. Accordingly, as is seen from the equation (2), the detection capacitance $C_{FD}$ can be reduced by lowering capacitance components $C_d$, $C_g$, and/or $C_l$.

While it is possible to reduce the capacitance component $C_d$ by reducing the size of the floating diffusion layer 112, a channel width in the range of about 5 to 10 μm must be secured so that a charge is securely transferred from the transfer channel 102. Therefore, it is undesirable to make the floating diffusion layer 112 as small as the current fine-processing technique allows it to be.

As will be appreciated, reduction of the gate capacitance $C_g$ and the parasitic capacitance $C_l$ is critical to the improvement of the charge/voltage conversion efficiency.

SUMMARY OF THE INVENTION

A charge transfer device according to the present invention includes: a transfer channel for transferring a charge in a charge transfer direction; a charge detecting section including a diffusion layer for storing the charge transferred through the transfer channel and for inducing a voltage corresponding to an amount of the stored charge; and a transistor for detecting the induced voltage, the transistor including: a gate electrode formed on the diffusion layer, the gate electrode being in direct contact with the diffusion layer; a gate insulating film formed on the gate electrode; and a channel region formed above the gate electrode.

In one embodiment of the invention, the gate electrode is in contact with the diffusion layer in a smaller area than an area in which the gate electrode is in contact with the channel region via the gate insulating film.

In another embodiment of the invention, the transistor is a part of a source follower amplifier.

In still another embodiment of the invention, the charge transfer device further includes; an output gate electrode formed on the transfer channel, the output gate electrode being elongated in a direction perpendicular to the charge transfer direction; and a reset gate electrode formed on the transfer channel; wherein the transistor is disposed between the output gate electrode and the reset gate electrode and the direction of a channel length of the transistor is perpendicular to the charge transfer direction.

According to another aspect of the invention, the charge transfer device includes: a transfer channel for transferring a charge; a charge detecting section including a diffusion layer for storing a charge transferred through the transfer channel and for inducing a voltage corresponding to the amount of the stored charge; and a transistor for detecting the induced voltage, the transistor including: an insulating film formed on the diffusion layer; a channel region formed above the diffusion layer; and a source and a drain each electrically connected to the channel region, the transistor controlling a current that flows in the channel region in accordance with the induced voltage.

In one embodiment of the invention, the channel width of the channel region is substantially the same as or larger than the width of the diffusion layer.

In another embodiment of the invention, the charge transfer device further includes a control gate electrode formed on the channel region, an insulating film being interposed between the control gate electrode and the channel region.

In still another embodiment of the invention, the charge transfer device further includes; an output gate electrode formed on the transfer channel, the output gate electrode being elongated in a direction perpendicular to a charge transfer direction; and a reset gate electrode formed on the transfer channel; wherein the transistor is disposed between the output gate electrode and the reset gate electrode and the direction of the channel length of the transistor is perpendicular to the charge transfer direction.

According to still another aspect of the invention, a method for producing a charge transfer device, comprising the steps of: forming a transfer channel for transferring a charge; forming a diffusion layer in the transfer channel, for storing a charge transferred through the transfer channel and for inducing a voltage corresponding to the amount of the stored charge; and forming a transistor for detecting the induced voltage at least on the diffusion layer.

A charge transfer device according to the present invention includes a thin film transistor on a floating diffusion layer of a charge detecting section, the thin film transistor constituting a part of a source follower amplifier. As a result, no wiring for electrically interconnecting the floating diffusion layer and the source follower amplifier is required, thus reducing the parasitic capacitance included in such wiring. The parasitic capacitance included in such wiring is, while depending on the layout pattern of the charge detecting section and fabricating conditions, estimated to account for some 30% of the charge to be normally detected by the charge detecting section. Moreover, a first stage driver transistor for converting the charge into an output signal is provided on the charge detecting section. This makes it unnecessary to dispose other transistors for further amplifying the output signal so as to be in the vicinity of the charge detecting section, since the location of those transistors does not affect the charge/voltage conversion efficiency of the charge transfer device. Thus, the parasitic capacitance included in the charge to be detected by the charge detecting section is reduced, thereby improving the charge/voltage conversion efficiency. It is also made possible to miniaturize the device and to relatively freely lay out the transistors constituting the source follower amplifier.

Thus, the invention described herein makes possible the advantages of (1) providing a small, high-performance charge transfer device in which the charge detection capacity is reduced so as to improve the charge/voltage conversion efficiency, and a method for the production thereof; and (2) minimizing restrictions concerning the layout of a charge transfer device, so that the charge transfer device can be fabricated at low costs and with a high yield.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying drawings.

EXAMPLE 1

Figure 1:
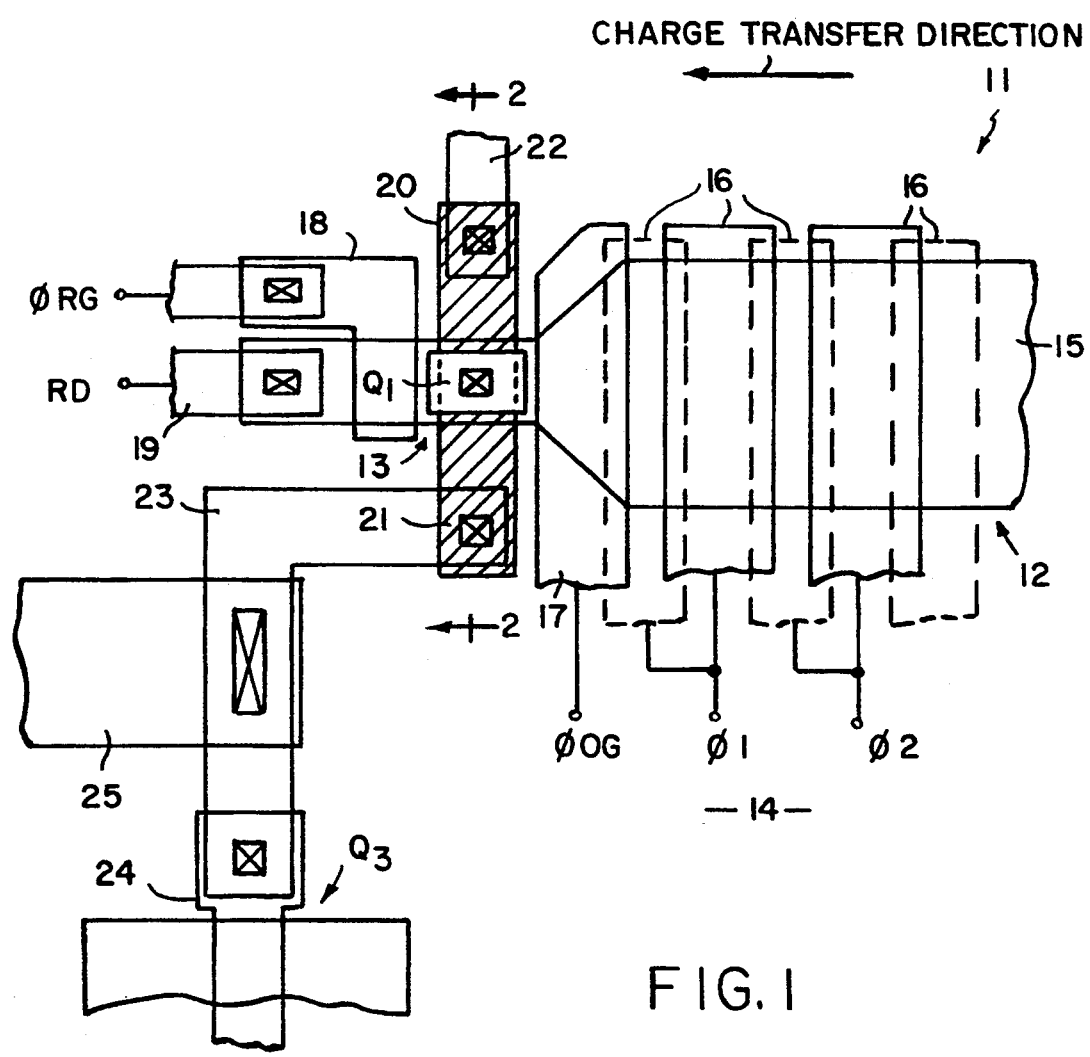
FIG. 1 is a plan view showing a portion of a charge transfer device according to a first example of the present invention.

FIG. 1 is a plan view showing in part a charge transfer device 11 according to the present invention. As is shown in FIG. 1, the charge transfer device 11 includes a transfer channel 12 for transferring a charge and a charge detecting section 13 for detecting a charge. The transfer channel 12 includes a transfer region 15 formed in a semiconductor substrate 14 and a plurality of transfer electrodes 16 formed on the transfer region 15. The transfer electrodes 16 are elongated in a direction perpendicular to the charge transfer direction shown by the arrow. An output gate electrode 17, a reset gate electrode 18, and a reset drain electrode 19 are formed on the transfer region 15. The charge detecting section 13 is formed in a portion of the transfer region 15 that is located between the output gate electrode 17 and the reset gate electrode 18. A charge is transferred in the transfer region 15 in the direction of the arrow shown in FIG. 1, in accordance with a two-phase clock pulse of $\Phi 1$ and $\Phi 2$ applied to the transfer electrodes 16. The charge is transferred to the charge detecting section 13 formed in the transfer region 15 in accordance with an output gate pulse $\Phi OG$ applied to the output gate electrode 17.

Figure 6:
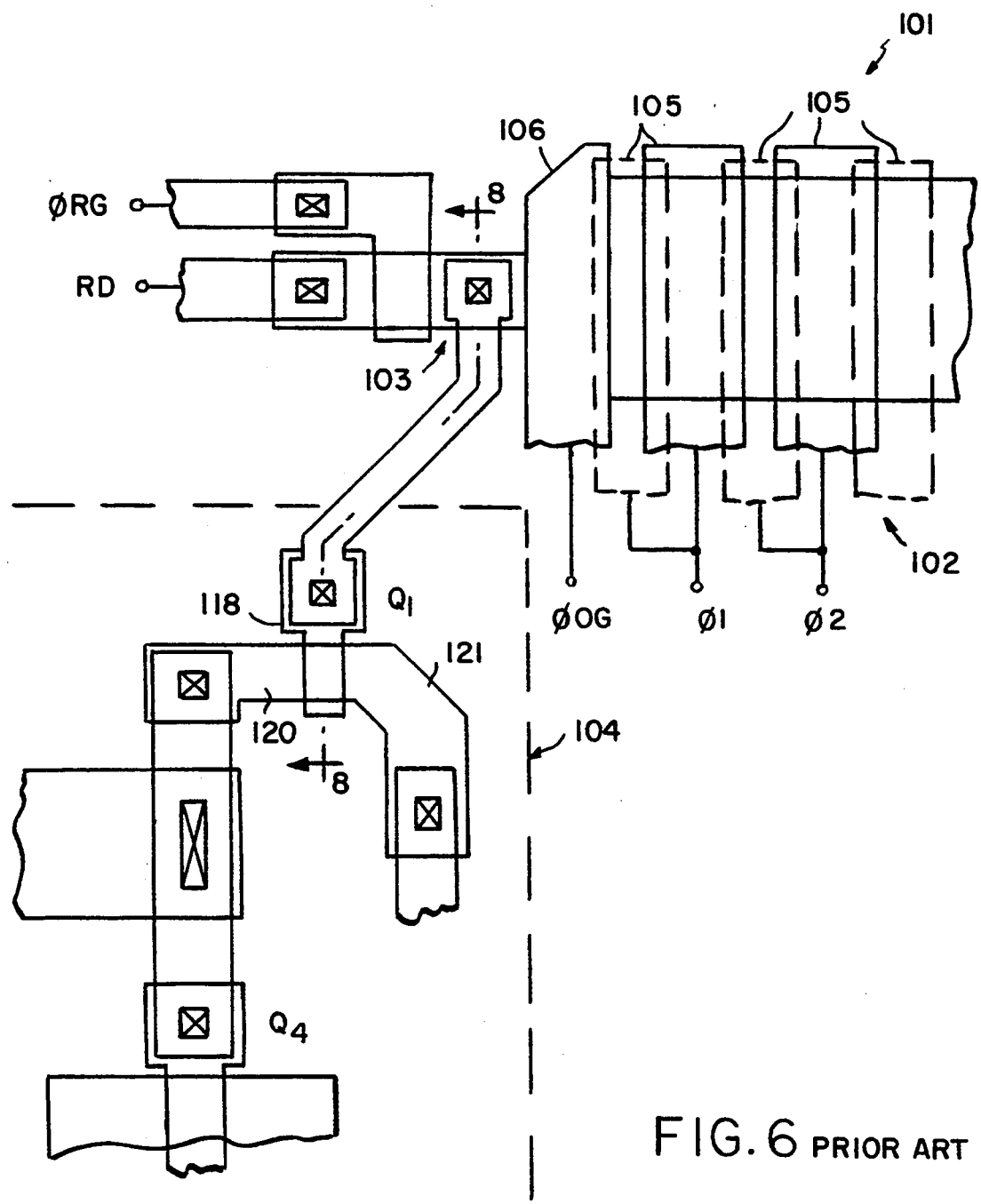
FIG. 6 is a plan view showing a portion of a conventional charge transfer device.

A transistor $Q_1$ having a drain 20 and a source 21 is disposed on the charge detecting section 13. The transistor $Q_1$ further has a channel region (not shown in FIG. 1) between the drain 20 and the source 21. The direction of a channel length of the transistor $Q_1$ is perpendicular to a charge transfer direction shown by the arrow. A voltage in proportion to an amount of charge stored in the charge detecting section 13 is detected by the transistor $Q_1$ as an output signal. The output signal is applied to a gate electrode 24 of a transistor $Q_3$ through a wire 23 connected to the source 21 of the transistor $Q_1$. The wire 23 is also connected to a transistor $Q_2$ (not shown) through a wire 25. The transistors $Q_1$, $Q_2$, $Q_3$, and $Q_4$ (not shown) constitute a source follower amplifier 104 shown in FIG. 6 and serve to amplify the output signal. When the output signal is detected, a reset gate pulse $\Phi RG$ is applied to the reset gate electrode 18, and the charge stored in the charge detecting section 13 is drained to the reset drain electrode 19.

Figure 2:
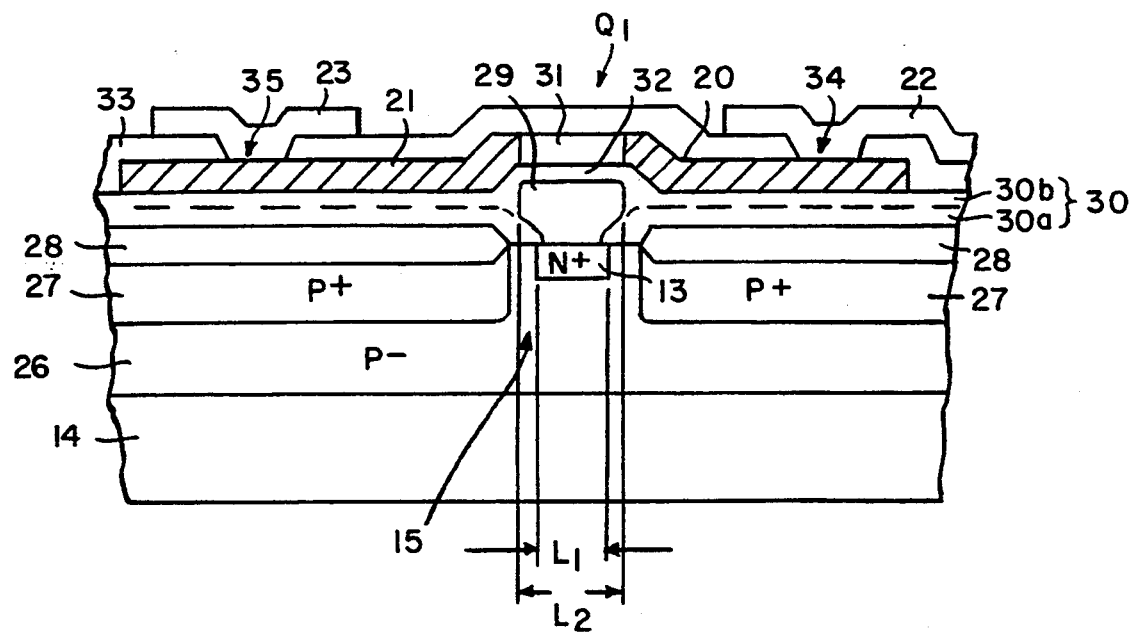
FIG. 2 is a view showing a 2—2 cross section of the charge transfer device shown in FIG. 1.

Hereinafter, the charge transfer device 11 according to the present example will be described in more detail, with reference to FIG. 2. FIG. 2 is a view showing the 2—2 cross section of the charge transfer device 11 shown in FIG. 1. As is shown in FIG. 2, a $P^-$-type first diffusion layer 26 is formed in the semiconductor substrate 14. A portion of the first diffusion layer 26 defines the transfer region 15. In the vicinity of a surface of the semiconductor substrate 14 excluding the transfer region 15, a $P^+$-type second diffusion layer 27 is formed. A LOCOS oxide film 28 is formed on the $P^+$-type second diffusion layer 27.

In the portion of the transfer region 15 located in the vicinity of the surface of the semiconductor substrate 14, the charge detecting section 13 is formed. The charge detecting section 13 is composed of an $N^+$-type diffusion layer, and approximately accounts for the area of a rectangular having the sides of lengths $L_1$ and $W_1$ (not shown). $L_1$ is measured along the direction of the channel length of the transistor $Q_1$ and $W_1$ is measured along the direction perpendicular to the channel length. A gate electrode 29 is formed on the charge detecting section 13. An oxide film 30 is formed so as to cover the LOCOS oxide film 28, the transfer region 15, and the gate electrode 29. The gate electrode 29 is formed so as to be larger at the top than at the bottom. The top portion of the gate electrode 29 constitutes a rectangular having the sides of lengths $L_2$ and $W_2$ (not shown), but accounts for a larger area than that of the charge detecting section 13. $L_2$ is also measured along the direction of the channel length of the transistor $Q_1$ and $W_2$ is measured along the perpendicular direction the channel length. On the oxide film 30, the drain 20, the source 21, and a channel region 31 interposed between the drain 20 and the source 21 are formed. A portion 32 of the oxide film 30 that is interposed between the channel region 31 and the gate electrode 29 functions as a gate oxide film (hereinafter the portion 32 will be referred to as 'the gate oxide film' 32). The transistor $Q_1$ is composed of the drain 20, the source 21, the channel region 31, the gate electrode 29, and the gate oxide film 32.

A passivation film 33 is formed so as to cover the transistor $Q_1$. The output drain electrode 22 and the drain 20 are interconnected via a contact hole 34. The wire 23 and the source 21 are interconnected via a contact hole 35.

As a charge which has been transferred through the transfer channel 12 is stored in the charge detecting section 13, a voltage is induced in the charge detecting section 13. The voltage is determined based on the detection capacitance $C_{FD}$ and the amount of the charge stored in the charge detecting section. Since the gate electrode 29 is in direct ohmic contact with the charge detecting section 13, a voltage induced in the charge detecting section 13 is applied to the gate electrode 29 of the transistor $Q_1$. As a result, in the transistor $Q_1$, a current in accordance with the voltage applied to the gate electrode 29 flows from the drain 22 to the source 21. Furthermore, the current is amplified by the transistors $Q_2$ to $Q_4$.

As is described above, the charge detecting section 13 and gate electrode 29 of the transistor $Q_1$ which works as a first driver of the source follower amplifier are in direct contact with each other. As a result, the parasitic capacitance $C_1$ shown in the equation (1) is eliminated, whereby the detection capacitance $C_{FD}$ is reduced. Therefore, as is seen from the equation (2), a larger voltage V is applied to the gate electrode 29 corresponding to a conventional amount of charge being stored in the charge detecting section 13. Thus, the charge/voltage conversion efficiency of the charge detecting section 13 is improved.

Moreover, the charge is converted into an output signal in the form of a current or a voltage at the transistor $Q_1$ formed on the charge detecting section 13. In other words, the charge/voltage conversion has already been performed at the transistor $Q_1$. Therefore, the detection capacitance $C_{FD}$ is not influenced by the parasitic capacitance of the wire 23 interconnecting the transistor $Q_1$ and the transistors $Q_2$ to $Q_4$. This makes it unnecessary to locate the transistors $Q_2$ to $Q_4$ closely to the transistor $Q_1$. The transistors $Q_2$ to $Q_4$ can be located relatively arbitrarily unless the resistance of the wire 23 creates an unfavorable effect.

In addition, the transistor $Q_1$ is formed on the charge detecting section 13 and between the output gate electrode 17 and the reset gate electrode 18 so that the direction of the channel length is perpendicular to the charge transfer direction. Such configuration needs no additional space for the transistor $Q_1$. Therefore, the charge transfer device 11 of the present invention can be made smaller than a convention charge transfer device.

As is shown in FIG. 2, the charge detecting section 13 can be formed as small as possible so as to minimize the junction capacitance $C_d$ of the charge detection section 13. On the other hand, the lengths $L_2$ and $W_2$ can be determined at minimum values which allows satisfactory operation of the transistor $Q_1$ without punch through, regardless of the size of the charge detecting section 13, by forming the gate electrode 29 in a general mushroom shape. Therefore, the present invention allows incorporation of a source follower amplifier with a sufficient amplitude as well as an improved charge/voltage conversion efficiency of the charge transfer device.

Hereinafter, a method for producing the charge transfer device 11 will be described, with reference to FIG. 2. First, the semiconductor substrate 14 composed of N-type silicon is doped with P-type impurities, whereby the P$^-$-type first diffusion layer 26 is formed. The doping with the P-type impurities is further conducted for the semiconductor substrate 14 excluding a portion thereof which defines the transfer channel 12, whereby the P$^+$-type second diffusion layer 27 is formed. The surface of the second diffusion layer 27 is oxidized to form the LOCOS oxide film 28 having a thickness of about 100 nm.

Next, a portion of the transfer channel 12 is doped with N-type impurities, whereby the charge detecting section 13 composed of an N$^+$-type floating diffusion layer is formed. The charge detecting section 13 is formed so as to approximately occupy the area of a rectangular having the sides of lengths of $L_1$ and $W_1$. The $L_1$ and $W_1$ should be set at small values so long as the gate electrode 29 can be satisfactorily in contact with the charge detection section 13. Such minimum values are determined by a design rule for producing the charge transfer device 11. After a silicon oxide film 30$a$ is formed over the entire surface of the semiconductor substrate 14, a contact hole (not shown) having approximately the same area as that of the charge detecting section 13 is formed. Thereafter, a Ti-W alloy is deposited and is patterned to form the gate electrode 29. The gate electrode 29 should preferably be heat-resistant, and may be formed of N$^+$ polysilicon or the like. The gate electrode 29 is formed so as to approximately occupy the area of a rectangular having the sides of lengths $L_2$ and $W_2$. The gate electrode 29 can be formed of a size which allows the transistor $Q_1$ to have predetermined properties. However, the lengths $L_2$ and $W_2$ are preferably determined at minimum values which allows satisfactory operation of the transistor $Q_1$ without punch through.

Next, a silicon oxide film 30$b$ is formed over the entire surface of the semiconductor substrate 14. A portion of the silicon oxide film 30$b$ that is located on the gate electrode 29 functions as the gate insulating film 32. An amorphous silicon film (not shown) having a thickness in the range of 50 to 100 nm is deposited on the silicon oxide film 30$b$ at a temperature of 500° to 600° C. by the use of a low pressure CVD (Chemical Vapor Deposition) method, and thereafter is subjected to a heat treatment for 10 to 20 hours under a nitrogen atmosphere to form a polycrystalline silicon film (not shown). The semiconductor substrate 14, excluding a portion thereof that defines the channel region of the transistor $Q_1$, is doped with N-type impurities, and the polycrystalline silicon film is patterned to form the drain 20, source 21, and channel region 31. After depositing the passivation film 33 over the entire surface of the semiconductor substrate 14 and forming the contact holes 34 and 35, the output electrode 22 and the wire 23 are formed.

No description is offered as to the fabrication of component elements such as the transfer electrode 16 shown in FIG. 1 in the above-described fabrication method. However, it is appreciated that the transfer electrode 16, the transistors $Q_2$ to $Q_4$, and other component elements mentioned above can be fabricated at certain steps during the above-described fabrication method. Moreover, the above-mentioned fabrication steps can be incorporated with a method for producing an apparatus to which the charge transfer device of the present invention is applied, such an imaging device, shift resister, memory device, etc.

Figure 3:
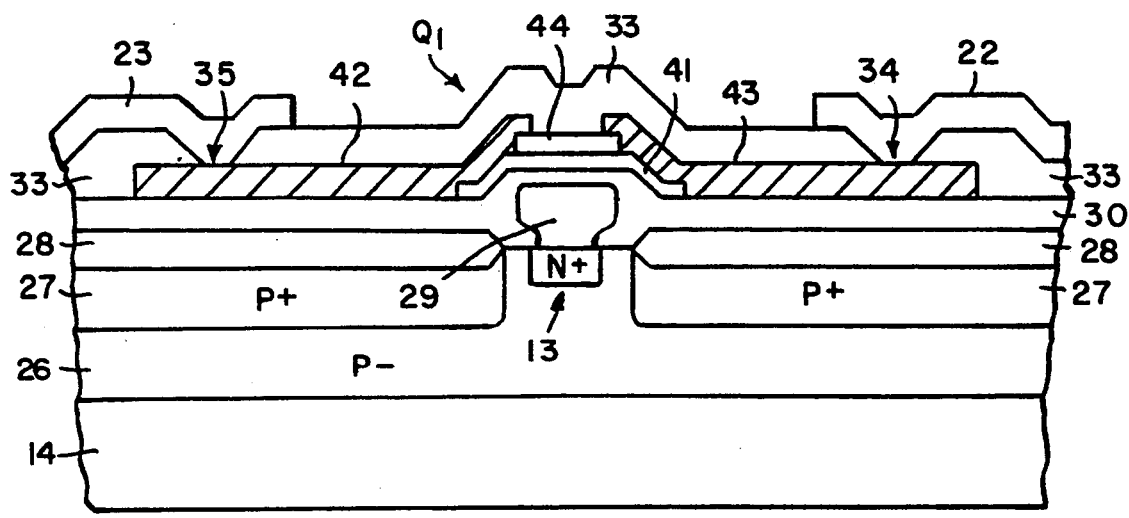
FIG. 3 is a cross-sectional view showing a variant of the charge transfer device according to the first example of the present invention.

One feature of the present invention is that the transistor $Q_1$ for converting the detected charge into an output signal is formed on the charge detecting section 13 without use of any wires. Various bottom gate-type TFTs (Thin Film Transistors) can be used as the transistor $Q_1$. For example, as is shown in FIG. 3, the transistor $Q_1$ may be an amorphous silicon TFT having a channel region 41 composed of amorphous silicon or polysilicon, a source 42 composed of N$^+$-type amorphous silicon or polysilicon, and a drain 43 composed of N$^+$-type amorphous silicon or polysilicon. An insulating film 44 insulates the source 42 from the drain 43.

EXAMPLE 2

Figure 4A:
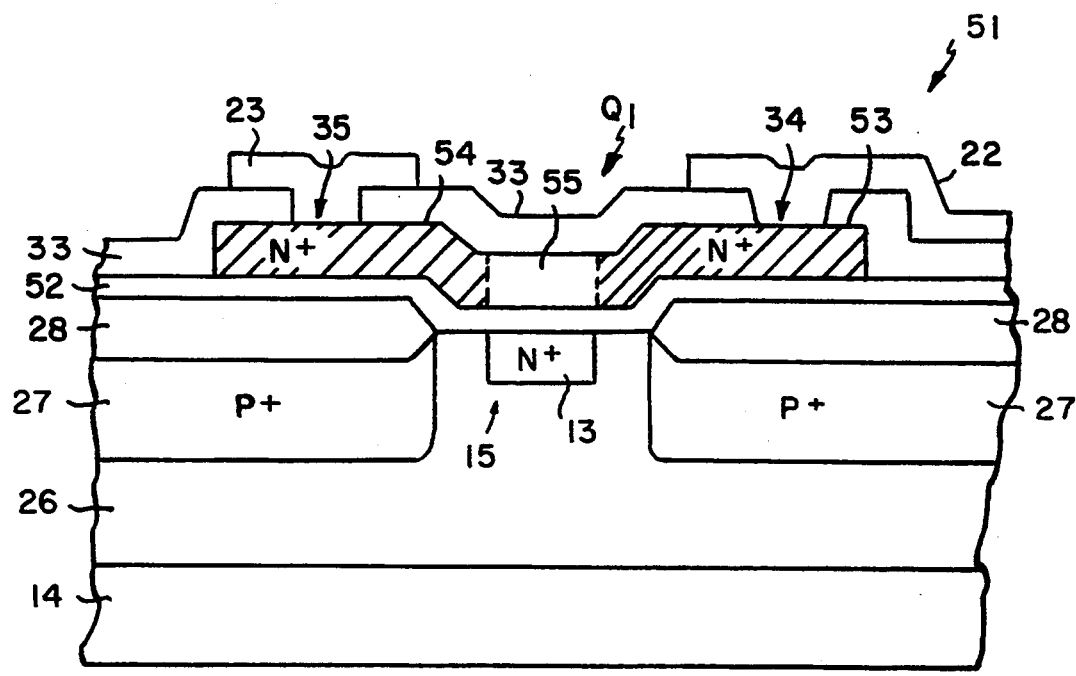
FIG. 4A is a cross-sectional view showing a charge transfer device according to a second example of the present invention.

FIG. 4A shows a cross section of a charge transfer device 51 according to the second example of the present invention, the cross section being taken in the vicinity of a charge detecting section 13. The charge transfer device 51 of the present example has the same configuration as that of the charge transfer device 11 of Example 1 except for the portion thereof shown in FIG. 2. Descriptions for any other portion than the said portion will be omitted. Component elements corresponding to those of the charge transfer device 11 are indicated by the same reference numerals.

As is shown in FIG. 4A, a P$^-$-type first diffusion layer 26 is formed in a semiconductor substrate 14. A portion of the first diffusion layer 26 defines a transfer region 15. In the vicinity of the surface of the semiconductor substrate 14 excluding the transfer region 15, a P$^+$-type second diffusion layer 27 is formed. A LOCOS oxide film 28, is formed on the P$^+$-type second diffusion layer 27.

In the portion of the transfer region 15 located in the vicinity of the surface of the semiconductor substrate 14, a charge detecting section 13 is formed. The charge detecting section 13 is composed of an N$^+$-type diffusion layer. An oxide film 52 is formed so as to cover the LOCOS oxide film 28 and the transfer region 15. On the oxide film 52, there are formed a drain 53, a source 54, and a channel region 55 interposed between the drain 53 and the source 54. The drain 53, the source 54, and the channel region 55 constitute a transistor $Q_1$ for a first driver transistor of a source follower amplifier. The charge detecting section 13 functions as a gate electrode of the transistor $Q_1$.

A passivation film 33 is formed so as to cover the entire area of the semiconductor substrate 14. An output drain electrode 22 and the drain 53 are interconnected via a contact hole 34. A wire 23 and the source 54 are interconnected via a contact hole 35.

As a charge which has been transferred through a transfer channel (not shown) is stored in the charge detecting section 13, a voltage is induced in the charge detecting section 13. The voltage is determined based on the capacitance of the charge detecting section 13 and the amount of the charge that has been transferred. The induced voltage forms a depletion layer directly in the channel region 55 of the transistor $Q_1$, without being transmitted through a gate electrode, so as to control current that flows from the drain 53 to the source 54. Furthermore, the current is amplified by transistors $Q_2$ to $Q_4$.

As is described above, the charge detecting section 13 itself functions as a gate electrode of the transistor $Q_1$. Therefore, it is unnecessary to incorporate any gate electrode made of refractory metals, as well as any wire to connect the charge detecting section 13 and the transistor $Q_1$. Therefore, no gate electrode made of refractory metals is formed in the charge transfer device 51, whereby the fabrication steps are simplified as compared to the fabrication of the charge transfer device 11 of Example 1.

Figure 4B:
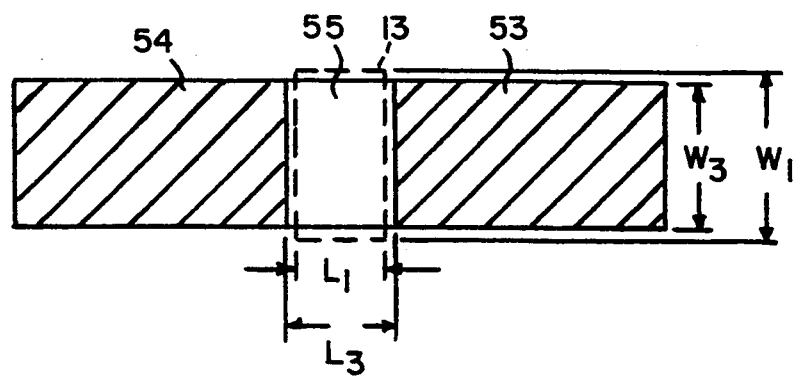
FIG. 4B is a plan view showing a transistor section of the charge transfer device shown in FIG. 4A.

In the transistor $Q_1$ of the charge transfer device 51, a current that flows in the channel region 55 is controlled by a voltage induced in the charge detecting section 13. If the channel region 55 is formed so as to be longer than the charge detecting section 13 in the direction of the channel width of the transistor $Q_1$, thus hanging or protruding over the charge detecting section 13, the protruding portion of the channel region 55 can not be controlled by the voltage induced in the charge detecting section 13. Therefore, it is preferable that the channel width of the channel region 55 in the transistor $Q_1$ is the same or smaller than the width of the charge detecting section 13. This will be described below in more detail with reference to FIG. 4B, which is a plan view showing the transistor section of the charge transfer device 51. The channel region 55 should be formed in such a way that the channel width $W_3$ of the transistor $Q_1$ is the same or smaller than the width $W_1$ of the charge detecting section 13. Moreover, the length $L_1$ of the charge detecting section 13 should be so small that the junction capacitance $C_d$ does not become large. However, the length $L_1$ should be large enough so that a depletion layer with a sufficient size for controlling a current flowing the channel region 13 is formed. For this reason, the length $L_1$ should preferably be approximately the same as the channel length $L_3$.

Figure 5:
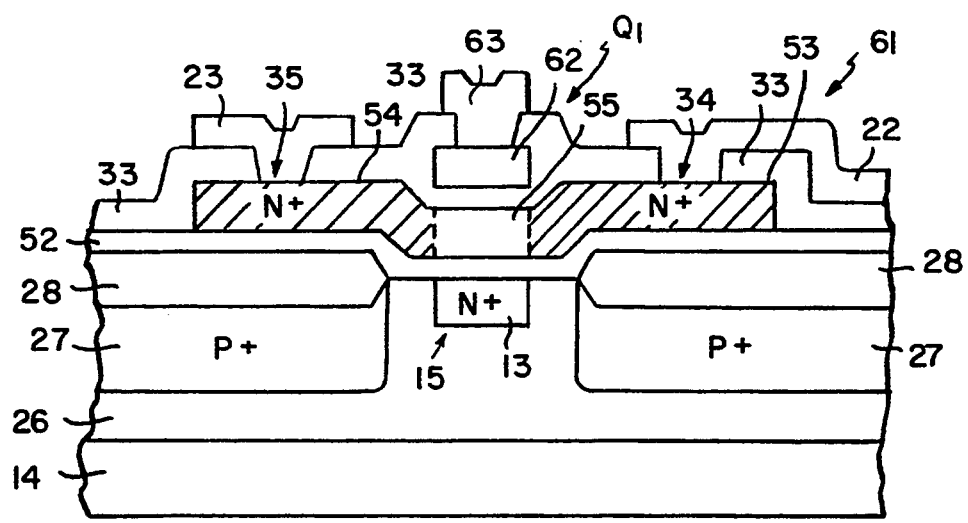
FIG. 5 is a cross-sectional view showing a variant of the charge transfer device according to the second example of the present invention.
Figure 7:
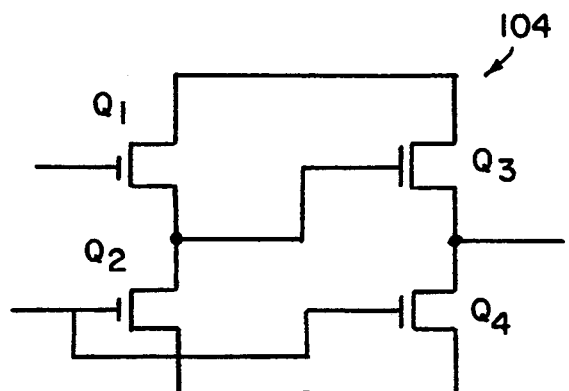
FIG. 7 is a circuit diagram showing an exemplary source follower amplifier to be used in a charge transfer device.
Figure 8:
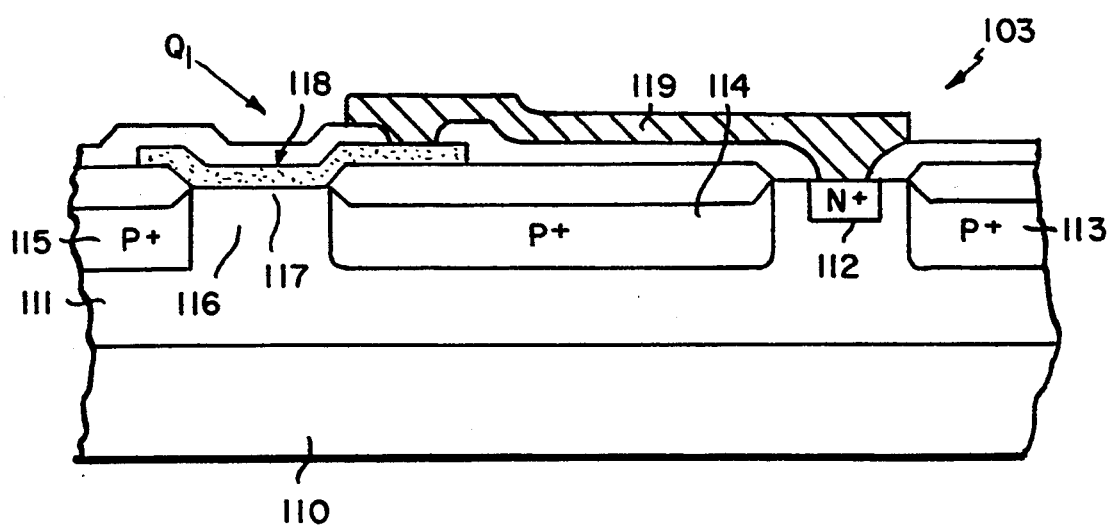
FIG. 8 is a view showing an 8—8 cross section of the charge transfer device shown in FIG. 6.

As one modification of Example 2 of the invention, a control gate may further be incorporated in the charge transfer device 51. FIG. 5 shows a cross section of a charge transfer device 61 having a control gate electrode 62, the cross section being taken in the vicinity of a charge detecting section 13 of the charge transfer device 61. As is shown in FIG. 5, in the charge transfer device 61, a control gate electrode 62 is formed above a channel region 55, with a portion of a passivation film 33 interposed therebetween. A wire 63 for applying a voltage is connected to the control gate electrode 62. The control gate electrode 62 accounts for substantially the same area as that of the channel region 55, so that a depletion layer is formed in the entire channel region 55 so as to control a current that flows therein. Accordingly, a transistor $Q_1$ satisfactorily detects a charge stored in the charge detecting section 13, whereby an output signal is obtained.

The above-described charge transfer devices 51 and 61 can be fabricated by a method similar to that for the charge transfer device 11 of Example 1. The channel region 55 of the transistor $Q_1$ is formed of polysilicon.

The present invention can be applied to various kinds of devices and apparatuses which essentially include a charge transfer device having a charge detection section. It is appreciated that the invention is suitable for use in a CCD solid state imaging device, a delay element, a transversal filter, etc. Application of the invention to such a device makes the device small and provides the device with the improved charge/voltage conversion efficiency.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A charge transfer device comprising:
   a transfer channel for transferring a charge in a charge transfer direction;
   a charge detecting section including a diffusion layer for storing the charge transferred through the transfer channel and for inducing a voltage corresponding to the amount of the stored charge; and
   a transistor for detecting the induced voltage, the transistor including: a gate electrode formed on the diffusion layer, the gate electrode being in direct contact with the diffusion layer; a gate insulating film formed on the gate electrode; and a channel region formed above the gate electrode.

2. A charge transfer device according to claim 1, wherein the gate electrode is in contact with the diffusion layer in a smaller area than the area in which the gate electrode is in contact with the channel region via the gate insulating film.

3. A charge transfer device according to claim 1, wherein the transistor is a part of a source follower amplifier.

4. A charge transfer device according to claim 1 further comprising;
   an output gate electrode formed over the transfer channel, the output gate electrode being elongated in a direction perpendicular to the charge transfer direction; and
   a reset gate electrode formed over the transfer channel; wherein the transistor is disposed between the output gate electrode and the reset gate electrode and the direction of the channel length of the transistor is perpendicular to the charge transfer direction.

5. A charge transfer device comprising:
   a transfer channel for transferring a charge;
   a charge detecting section including a diffusion layer for storing a charge transferred through the transfer channel and for inducing a voltage corresponding to an amount of the stored charge thereat; and
   a transistor for detecting the induced voltage, the transistor including: an insulating film formed on the diffusion layer; a channel region formed above the diffusion layer; and a source and a drain each electrically connected to the channel region, wherein a current flowing in the channel region is controlled by the induced voltage.

6. A charge transfer device according to claim 5, wherein the channel width of the channel region is substantially the same as or smaller than a width of the diffusion layer.

7. A charge transfer device according to claim 5 further comprising a control gate electrode formed on the channel region, an insulating film being interposed between the control gate electrode and the channel region.

8. A charge transfer device according to claim 5 further comprising;
   an output gate electrode formed on the transfer channel, the output gate electrode being elongated in a direction perpendicular to the charge transfer direction; and
   a reset gate electrode formed on the transfer channel; wherein the transistor is disposed between the output gate electrode and the reset gate electrode and the direction of the channel length of the transistor is perpendicular to the charge transfer direction.

* * * * *